(12) United States Patent
Iino

(10) Patent No.: US 6,747,467 B2
(45) Date of Patent: Jun. 8, 2004

(54) ASSEMBLY APPARATUS AND METHOD OF CONTACTOR

(75) Inventor: Shinji Iino, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/985,358

(22) Filed: Nov. 2, 2001

(65) Prior Publication Data

US 2002/0053922 A1 May 9, 2002

(30) Foreign Application Priority Data

Nov. 6, 2000 (JP) ............................. 2000-336901

(51) Int. Cl.⁷ ............................................. G01R 31/02
(52) U.S. Cl. ........................................................ 324/758
(58) Field of Search .................................. 324/765, 758, 324/158.1, 754, 761, 762, 755

(56) References Cited

U.S. PATENT DOCUMENTS

| | | | | |
|---|---|---|---|---|
| 5,521,522 A | * | 5/1996 | Abe et al. | 324/758 |
| 5,806,181 A | | 9/1998 | Khandros et al. | |
| 5,828,225 A | * | 10/1998 | Obikane et al. | 324/758 |
| 5,828,226 A | | 10/1998 | Higgins et al. | |
| 5,982,183 A | * | 11/1999 | Sano | 324/754 |
| 6,084,419 A | * | 7/2000 | Sato et al. | 324/754 |
| 6,111,421 A | * | 8/2000 | Takahashi et al. | 324/758 |
| 6,124,725 A | * | 9/2000 | Sato | 324/765 |

FOREIGN PATENT DOCUMENTS

JP 11-133062 5/1999

* cited by examiner

*Primary Examiner*—Evan Pert
*Assistant Examiner*—Jimmy Nguyen
(74) *Attorney, Agent, or Firm*—Oblon, Spivak, McClelland, Maier & Neustadt, P.C.

(57) ABSTRACT

An assembly apparatus of a contactor including unit contactors and a base substrate. The apparatus includes a laying mechanism for laying a substrate for alignment, a first conveying mechanism for conveying a plurality of unit contactors to the substrate for alignment laid on the laying mechanism, a second conveying mechanism for conveying a base substrate, a holding mechanism for holding the base substrate, and a positioning mechanism for positioning the substrate for alignment with the plurality of unit contactors disposed thereon and the base substrate. Also included is a contact mechanism for bringing the plurality of unit contactors disposed on the substrate for alignment into contact with the base substrate, and a heating mechanism for heating at least one of the substrate for alignment and base substrate to electrically connect the plurality of unit contactors disposed on the substrate for alignment to the base substrate.

11 Claims, 6 Drawing Sheets

ASSEMBLY APPARATUS AND METHOD OF CONTACTOR

CROSS-REFERENCE TO RELATED APPLICATIONS

This application is based upon and claims the benefit of priority from the prior Japanese Patent Application No. 2000-336901, filed Nov. 6, 2000, the entire contents of which are incorporated herein by reference.

BACKGROUND OF THE INVENTION

1. Field of the Invention

The present invention relates to an apparatus and method for assembling a contactor for use in testing electric properties of an object to be tested.

2. Description of the Related Art

In a manufacturing process of a semiconductor apparatus, electric properties of the semiconductor apparatus are tested a number of times. For example, in a stage of a semiconductor wafer (hereinafter referred to as "wafer"), a probe apparatus is used to perform a probe test. When the probe test is performed, contactors contact electrode pads of an integrated circuit (hereinafter referred to as "device") formed on the wafer. Hand in hand with the ultrahigh integration, and enlargement of wafers, go the lengthening of the test time. As a result, the cost of testing the wafers tends to keep rising. In order to shorten the test time, the number of devices to be tested at the same time can be increased. Various multiplexed contactors have therefore been developed.

A probing section usually has a contactor section having probes for contacting the electrode pads of the device, and an interface section which serves as an interface between the contactor section and a tester. The contactor section is formed by a disc-shaped wiring substrate, for example, with a large number of probes formed on the surface thereof. The interface section, for connecting the contactor section to the tester, is formed of a substrate.

During preparation of the probing section, generally the contactor section is formed separately from the interface section. Therefore, it is necessary to electrically connect these sections to each other. As a conventional connection system, an interface system is employed in which connection members such as an elastomer and spring pin are utilized.

For an assembly price of the probing section by a conventional interface system, the price of the connection member is added to that of the contactor. Therefore, reduction of the price of the contactor, and reduction of the test cost are inhibited. Moreover, since a wiring of the connection member is added to a transmission line, the transmission line is lengthened. Therefore, as transmission signals are attenuated, it becomes difficult to match the line impedance, which limits the signal transmission speed. In a Rambus memory, in order to satisfy the demand that the delay caused by the wiring length is to be suppressed below ten picoseconds, it is necessary to suppress a line length difference within 1 mm even with use of an impedance matching line.

On the other hand, a contactor for multiplexing is prepared with one tile at present. Therefore, the relative precision of each component in the tile does not raise a problem. However, along with the progress in high integration, multiplexing, and enlargement of tile size in the future, the thermal expansion of the tile, manufacturing cost, ease of maintenance, and the like will all raise problems. Concurrently, the number of probes also increases. It only takes one defective probe of a device to render the whole unit defective, which thus reduces overall productivity.

BRIEF SUMMARY OF THE INVENTION

The present invention has been developed to solve at least one of the above problems. An object of the present invention is to provide an assembly apparatus and method in which a contactor can be assembled with high precision in order to cope with the progress of multiplexing. Another object of the present invention is to provide an assembly apparatus and method in which the contactor can be efficiently assembled. A further object of the present invention is to provide an assembly apparatus and method in which the contactor can be produced at a low cost.

According to a first aspect of the present invention, there is provided an assembly apparatus of a contactor comprising a unit contactor and a base substrate, for use in testing the electric properties of an object to be tested, the apparatus comprising: a laying mechanism configured to lay a substrate for alignment; a first conveying mechanism configured to convey a plurality of unit contactors to the substrate for alignment laid on the laying mechanism; a second conveying mechanism configured to convey a base substrate; a holding mechanism configured to hold the base substrate; a positioning mechanism configured to position the substrate for alignment with the plurality of unit contactors disposed thereon and the base substrate; a contact mechanism configured to bring the plurality of unit contactors disposed on the substrate for alignment into contact with the base substrate. Preferably the assembly apparatus of the contactor further comprises a connecting mechanism configured to electrically connect the plurality of unit contactors disposed on the substrate for alignment to the base substrate.

Preferably in the assembly apparatus, the contact mechanism further comprises a pressing mechanism configured to bring the plurality of unit contactors into contact with the base substrate in an elastic manner.

The connecting mechanism of the assembly apparatus preferably heats the unit contactors and base substrate by a heating mechanism disposed in at least one of the laying mechanism and the pressing mechanism to electrically connect the unit contactors and base substrate to each other.

The assembly apparatus preferably further comprises a third conveying mechanism for conveying the substrate for alignment.

The substrate for alignment of the assembly apparatus preferably has grooves for containing probes of the unit contactors.

According to a second aspect of the present invention, there is provided a method of assembling a contactor for use in testing electric properties of an object to be tested from unit contactors and a base substrate, the method comprising steps of: positioning the unit contactor with respect to a substrate for alignment; disposing the positioned unit contactor in a predetermined position of the substrate for alignment; repeating the positioning and disposing steps to dispose a predetermined number of unit contactors on the substrate for alignment; positioning the substrate for alignment and a base substrate; disposing the substrate for alignment in the vicinity of the base substrate, and bringing the plurality of unit contactors disposed on the substrate for alignment into contact with the base substrate; and fixing the plurality of unit contactors disposed on the substrate for alignment to the base substrate.

In the assembly method, bringing the plurality of unit contactors disposed on the substrate for alignment into contact with the base substrate preferably comprises bringing the substrate for alignment into contact with the base substrate by an elastic force via pressing means.

According to a third aspect of the present invention, there is provided a contactor comprising:

a base substrate, the base substrate comprising:
an electrically insulating first substrate, the first substrate having a first surface and a second surface;
at least one first connection pad formed on a first surface of the first substrate;
at least one electrode for external connection formed on a second surface of the first substrate; and
a wiring configured to connect each first connection pad to each electrode for external connection;

a unit contactor, the unit contactor comprising:
an electrically insulating second substrate, the second substrate having a first surface and a second surface;
at least one connection pad formed on the first surface of the second substrate;
at least one probe formed on the second surface of the second substrate; and
a wiring configured to electrically connect each connection pad to each probe; and an attaching mechanism configured to fix a plurality of unit contactors onto the first surface of the base substrate.

The attaching mechanism of the contactor preferably comprises a mechanism configured to electrically connect and fix each second connection pad of each unit contactor to each connection pad of the base substrate.

The attaching mechanism of the contactor preferably comprises a mechanism configured to electrically connect and fix each second connection pad of each unit contactor to each connection pad of the base substrate via at least one of a solder and a wax.

A main material of the solder of the contactor is preferably gold.

The plurality of probes of the contactor are preferably of a cantilever type.

According to a fourth aspect of the present invention, there is provided a substrate for alignment having a first surface, which can be used to manufacture a contactor comprising a unit contactor. The substrate for alignment comprises: a plurality of convex portions formed on the first surface; a plurality of concave portions formed among the plurality of convex portions; and a plurality of grooves formed in the concave portions.

Here, the unit contactor comprises at least one probe. The convex portions support each unit contactor, and the grooves contain a tip end of the probe of each unit contactor.

The substrate for alignment is preferably mainly manufactured of silicon.

The probes of the substrate for alignment are preferably of a cantilever type.

According to a fifth aspect of the present invention, there is provided a method of manufacturing a contactor which uses a substrate for alignment, the method comprising steps of:

disposing a predetermined number of unit contactors on the substrate for alignment;
positioning the substrate for alignment and a base substrate;
bringing the plurality of unit contactors disposed on the substrate for alignment into contact with the base substrate; and
heating at least one of the substrate for alignment and the base substrate, and fixing the unit contactors to the base substrate.

According to a sixth aspect of the present invention, there is provided an assembly apparatus which can be used to assemble a contactor, the apparatus comprising:

means for laying a base substrate;
means for positioning the substrate for alignment with a unit contactor disposed thereon and the base substrate; and
means for disposing the substrate for alignment in the vicinity of the base substrate, and attaching the unit contactor disposed on the substrate for alignment to a predetermined position of the base substrate.

In the assembly apparatus, the attaching means preferably comprises:

means for bringing the unit contactor disposed on the substrate for alignment into contact with the base substrate; and
heating means for heating at least one of the substrate for alignment and the base substrate, and fixing a plurality of unit contactors to the base substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a diagram showing one embodiment of an assembly apparatus of the present invention.

FIG. 3 is an enlarged view of a tile shown in FIG. 1.

FIG. 4 is an enlarged view of a substrate for alignment shown in FIG. 1.

FIG. 5 is a view showing a base substrate conveying mechanism shown in FIG. 1.

FIG. 7 is a view of a main part of the holding mechanism shown in FIG. 1, showing a state in which the tile is connected to a base substrate.

DETAILED DESCRIPTION OF THE INVENTION

The present invention will be described hereinafter with reference to an embodiment shown in FIGS. 1 to 7. An object to be tested in the embodiment is a semiconductor wafer for the sake of convenience, but the present invention is not limited to the embodiment.

Figure 1A:
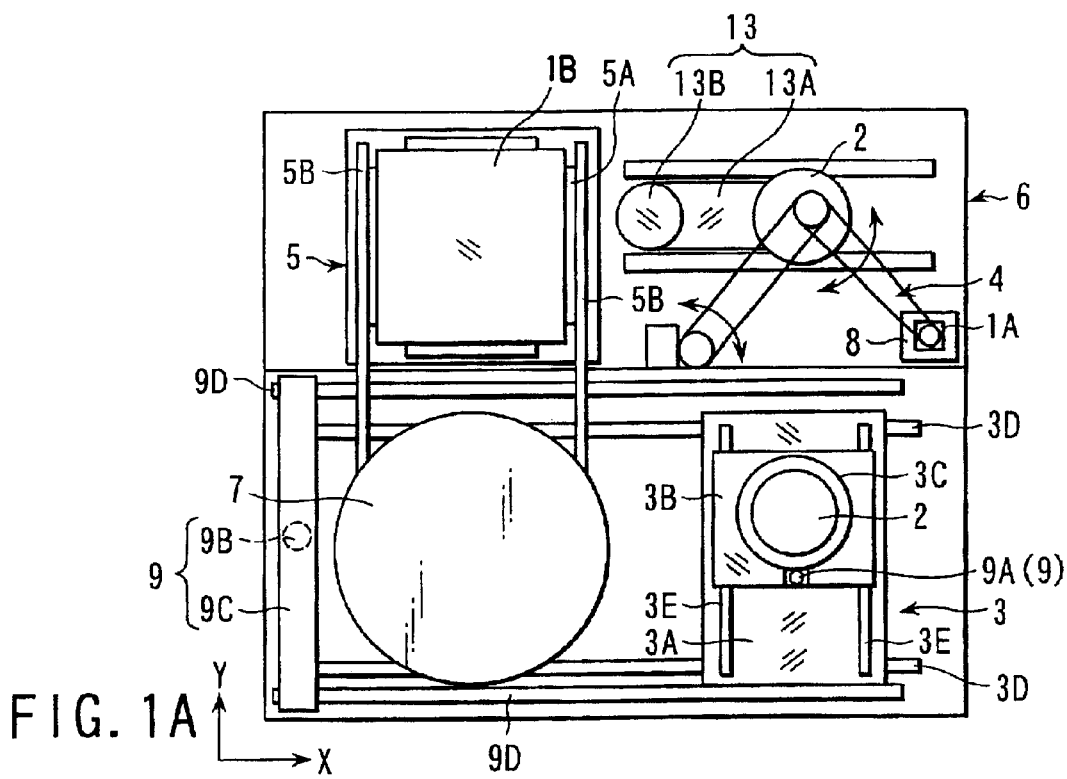
FIG. 1A is a plan view of the apparatus.
Figure 1B:
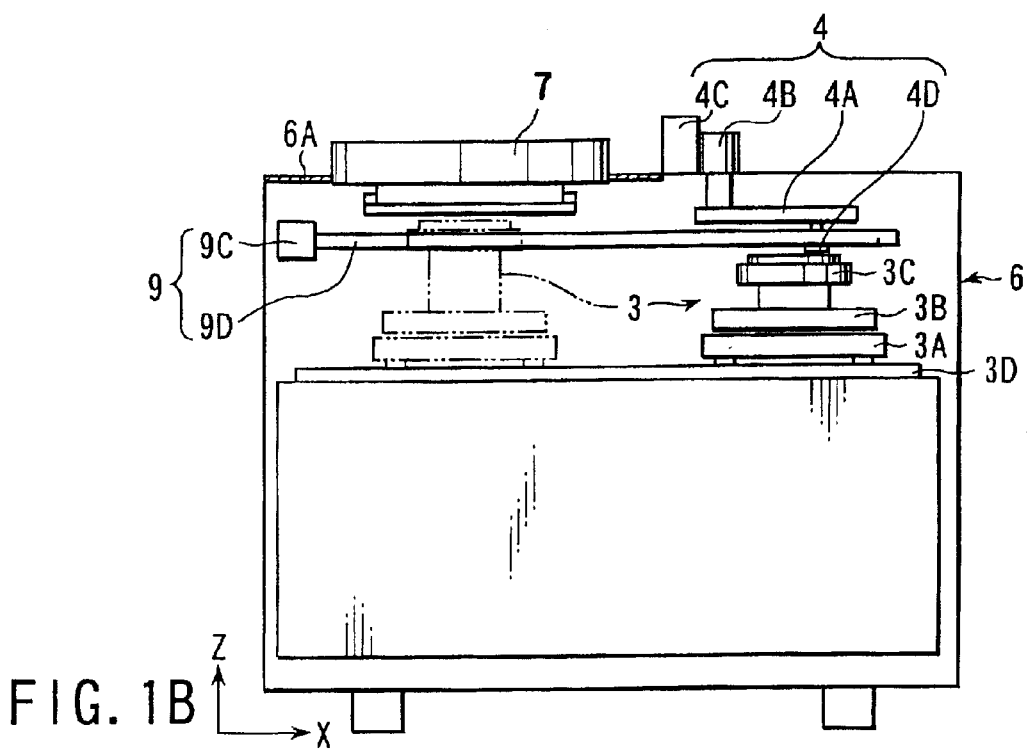
FIG. 1B is a sectional view thereof.

A contactor 1 for use in testing electric properties of a semiconductor wafer (not shown) is assembled from a unit contactor (hereinafter referred to as "tile") 1A and a base substrate 1B by an assembly apparatus of the contactor (hereinafter referred to simply as "assembly apparatus") according to the present embodiment. The unit contactor 1A is a contactor section which electrically contacts an electrode of at least one device formed on the wafer. For example, as shown in FIGS. 1A, 1B, the assembly apparatus comprises a chuck top mechanism 3 for laying and moving a unit contactor alignment substrate (hereinafter referred to as "substrate for alignment") 2 in X, Y, Z directions; a first conveying mechanism (hereinafter referred to as "tile conveying mechanism") 4 for conveying the tile 1A to a predetermined position of the substrate for alignment 2 disposed on the chuck top mechanism 3; and a second conveying mechanism (hereinafter referred to as "base substrate conveying mechanism") 5, disposed to be movable in the Y direction, for conveying the base substrate 1B. The assembly apparatus is contained in a housing 6.

Figure 3A:
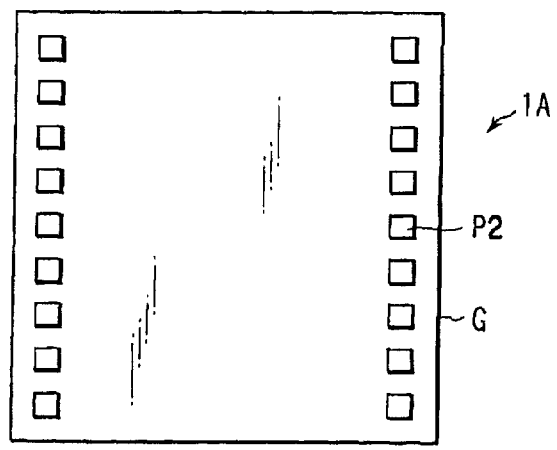
FIG. 3A is a plan view of a connection pad side.
Figure 3B:
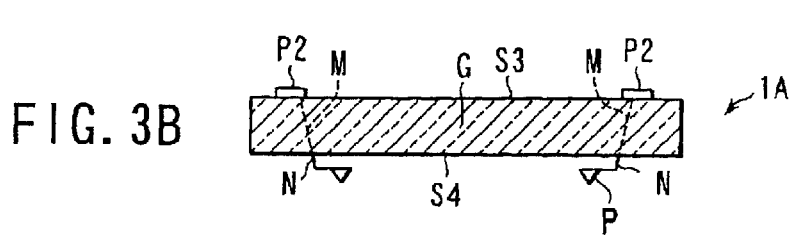
FIG. 3B is a sectional view thereof.

An example of the tile 1A is shown in FIGS. 3A, 3B. The tile 1A includes an electrically insulating glass substrate (second substrate) G, probes N (e.g., probes of a cantilever type) attached to a second surface S4 of the glass substrate G, and connection pads P2 formed on a first surface S3 of the glass substrate G. The tile 1A can be formed opposite to each device as an object to be tested. A tip end of each of the probes N is formed in a pyramid shape.

Figure 4A:
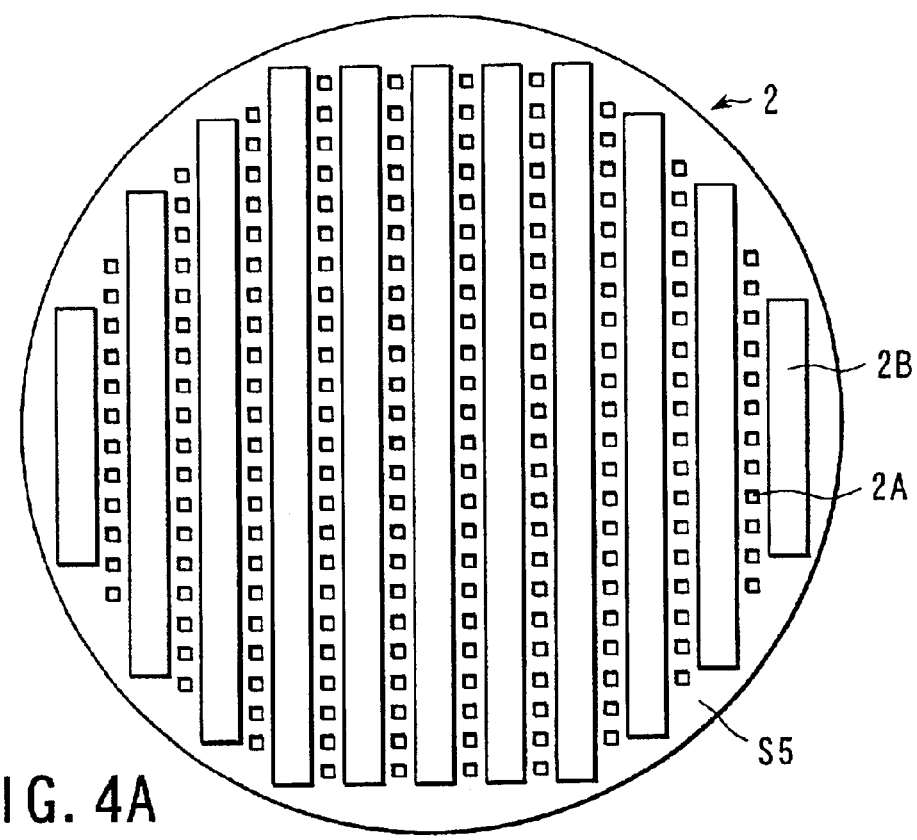
FIG. 4A is a plan view of the substrate.
Figure 4B:
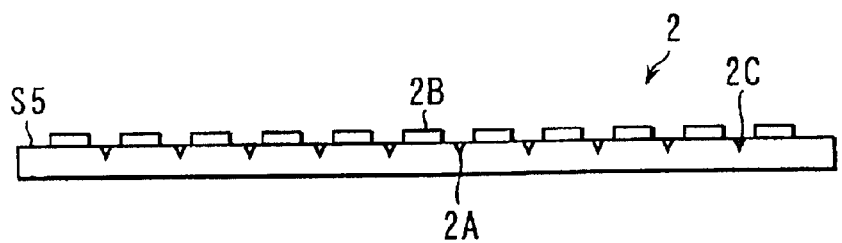
FIG. 4B is a sectional view thereof.

An example of the substrate for alignment 2 is shown in FIGS. 4A, 4B. A concave portion 2C and convex portion 2B are formed in a rib shape in a first surface S5 of the substrate for alignment 2. A plurality of grooves 2A are formed in the concave portions 2C in accordance with arrangement of the probes N of the tile 1A. The grooves 2A are formed in inverse pyramid shapes, and arranged in a matrix form. The substrate for alignment 2 can be formed, for example, by a silicon wafer. When the tile 1A is disposed on the substrate for alignment 2, the tip end (pyramid portion) of each of the probes of the tile 1A is contained in the groove 2A of the substrate for alignment 2. As a result, when the second surface S4 of the glass substrate G of the tile 1A contacts the concave portion 2B of the substrate for alignment 2, the probe N is protected from damage.

Figure 7A:
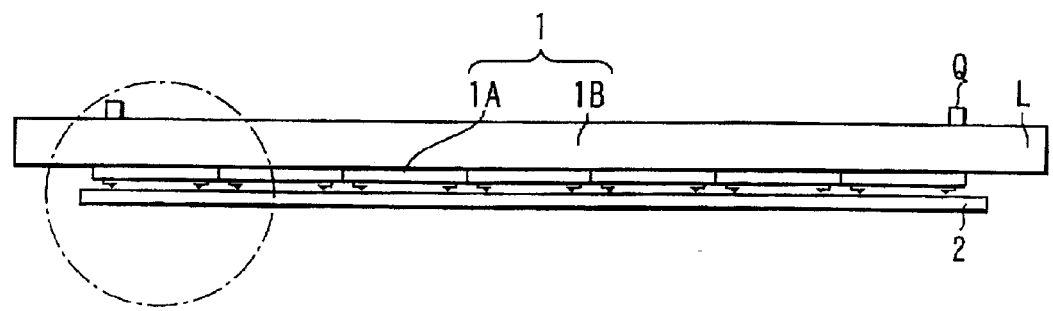
FIG. 7A is a sectional view of the whole mechanism.
Figure 7B:
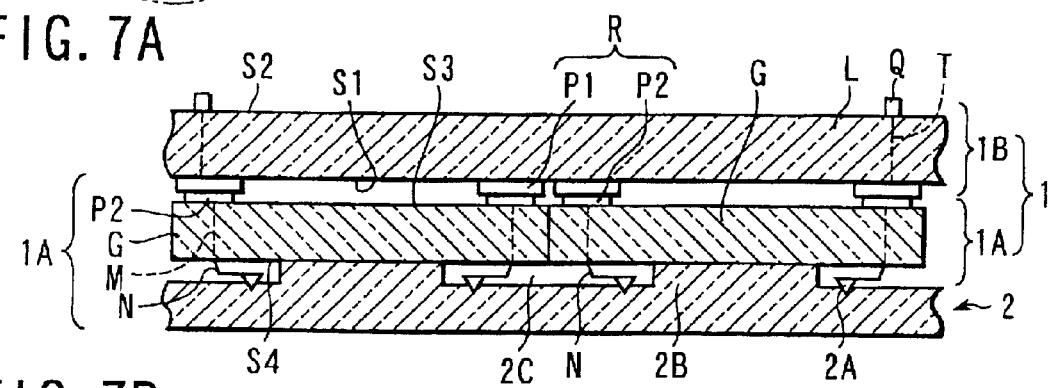
FIGS. 7B and 7C are enlarged sectional views of an encircled portion of FIG. 7A.

An example of the base substrate 1B is shown in FIG. 7B. The base substrate 1B includes: an electrically insulating first substrate L; at least one first connection pad P1 formed on a first surface S1 of the first substrate L; at least one electrode Q for external connection formed on a second surface S2 of the first substrate L, and a wiring T for electrically connecting the first connection pad P1 to the electrode Q for external connection. The first substrate L can be formed of the same material as that of the tile 1A, or a material whose thermal expansion coefficient is close to that of the glass substrate G of the tile 1A.

As a preparation step for disposing the tile 1A on the base substrate 1B, the tile 1A is aligned in the predetermined position on the substrate for alignment 2. For example, in the contactor for testing a plurality of devices formed on the wafer one by one, one tile 1A can be aligned in the predetermined position (e.g., center portion) of the substrate for alignment 2. In the contactor for multiplexing, a plurality of tiles 1A for the corresponding number of devices to be contacted at the same time can be aligned in a plurality of predetermined positions on the substrate for alignment 2. In the contactor which simultaneously contacts all the devices formed on the wafer, the tile 1A can be disposed on the whole surface of the substrate for alignment 2.

Figure 6:
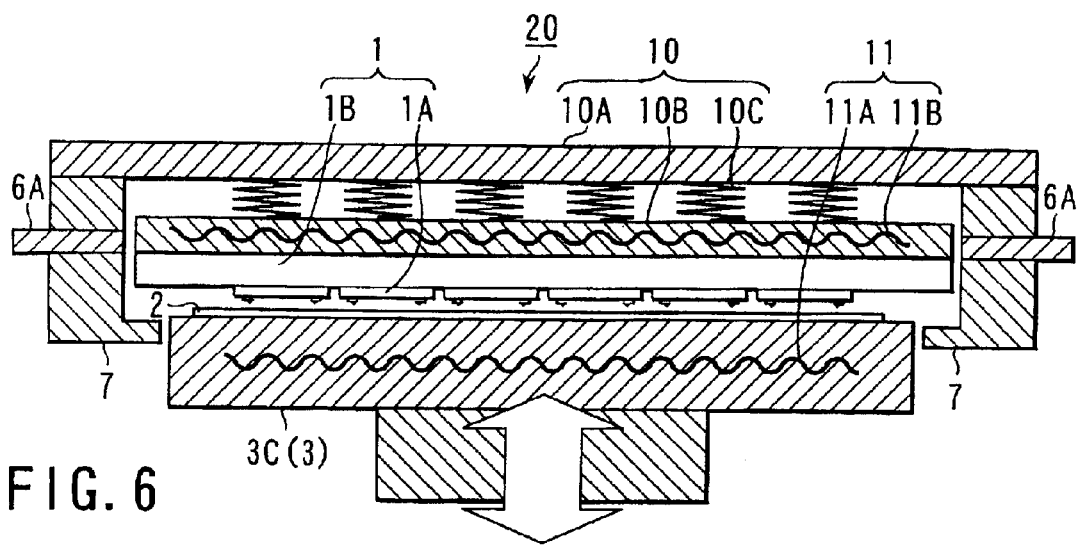
FIG. 6 is an enlarged sectional view of a holding mechanism shown in FIG. 1.

As described later, after the tile 1A aligned on the substrate for alignment 2 is positioned with the base substrate 1B, the tile 1A is allowed to contact the base substrate 1B as shown in FIG. 6. When at least one of the tile 1A and base substrate 1B is heated, both components are electrically connected to each other. The connection will be described with reference to FIGS. 7A to 7C. In FIG. 7B, a plurality of tiles 1A disposed on the substrate for alignment 2 are allowed to contact the base substrate 1B. In this state, when the plurality of tiles 1A and/or the base substrate 1B are heated, the connection pad P2 of the tile 1A and the connection pad P1 of the base substrate are melted and attached via a solder H shown in FIG. 7C to constitute an attaching mechanism R. The attaching mechanism R is not limited to this example, but when both connection pads are electrically connected to each other by the attaching mechanism, the contactor 1 shown in FIG. 7A is assembled.

An example of the assembly apparatus of the present invention will be described with reference to FIG. 1. As shown in FIGS. 1A and 1B, the laying mechanism 3 with the substrate for alignment 2 laid thereon includes an X stage 3A, Y stage 3B and base 3C. The X stage 3A moves along a pair of X guide rails 3D—3D disposed along an X direction, and the Y stage 3B moves along a pair of Y guide rails 3E—3E disposed on the X stage 3A along the Y direction. Moreover, the base 3C with the substrate for alignment 2 laid thereon moves up/down in a Z direction as shown by a dashed line of FIG. 1B. A holding mechanism 7 for holding the base substrate 1B is disposed on a left side of the X guide rails 3D—3D.

Figure 2:
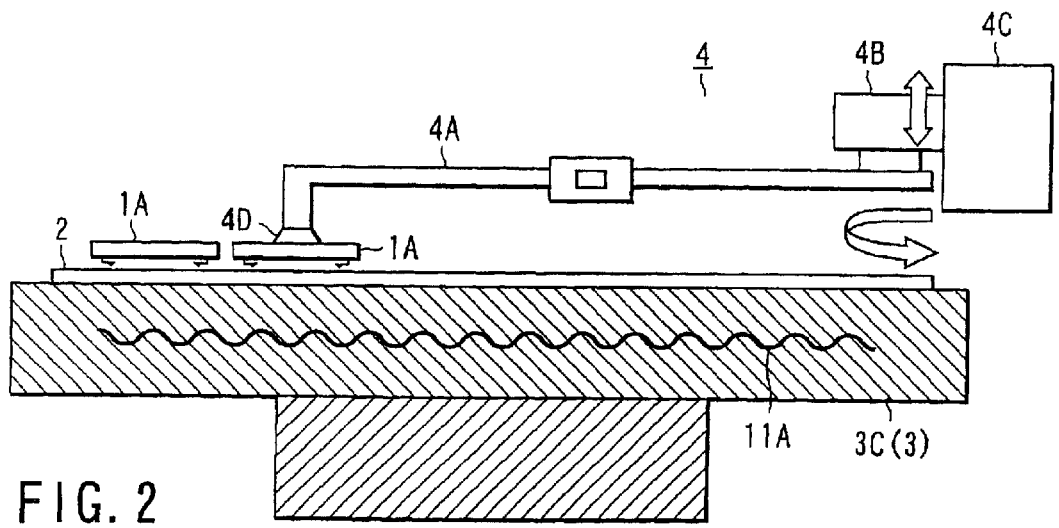
FIG. 2 is an enlarged view of a tile conveying mechanism shown in FIG. 1.

As shown in FIGS. 1A and 2, the first conveying mechanism 4 for conveying the tile includes: an arm 4A which can be bent/stretched via a joint; a rotating/driving mechanism 4B connected to a base end of the arm 4A; an elevating mechanism 4C; and an adsorption pad 4D attached to a tip end of the arm 4A. The first conveying mechanism 4 adsorbs/holds the tile 1A on a base 8 by the adsorption pad 4D via the rotating/driving mechanism 4B and joint, and conveys the tile 1A to the predetermined position on the substrate for alignment 2 on the base 3C. The first conveying mechanism 4 disposes the tile 1A in the predetermined position on the substrate for alignment 2 based on position data on the time when the tile 1A and substrate for alignment 2 were positioned by a positioning mechanism 9.

Figure 5A:
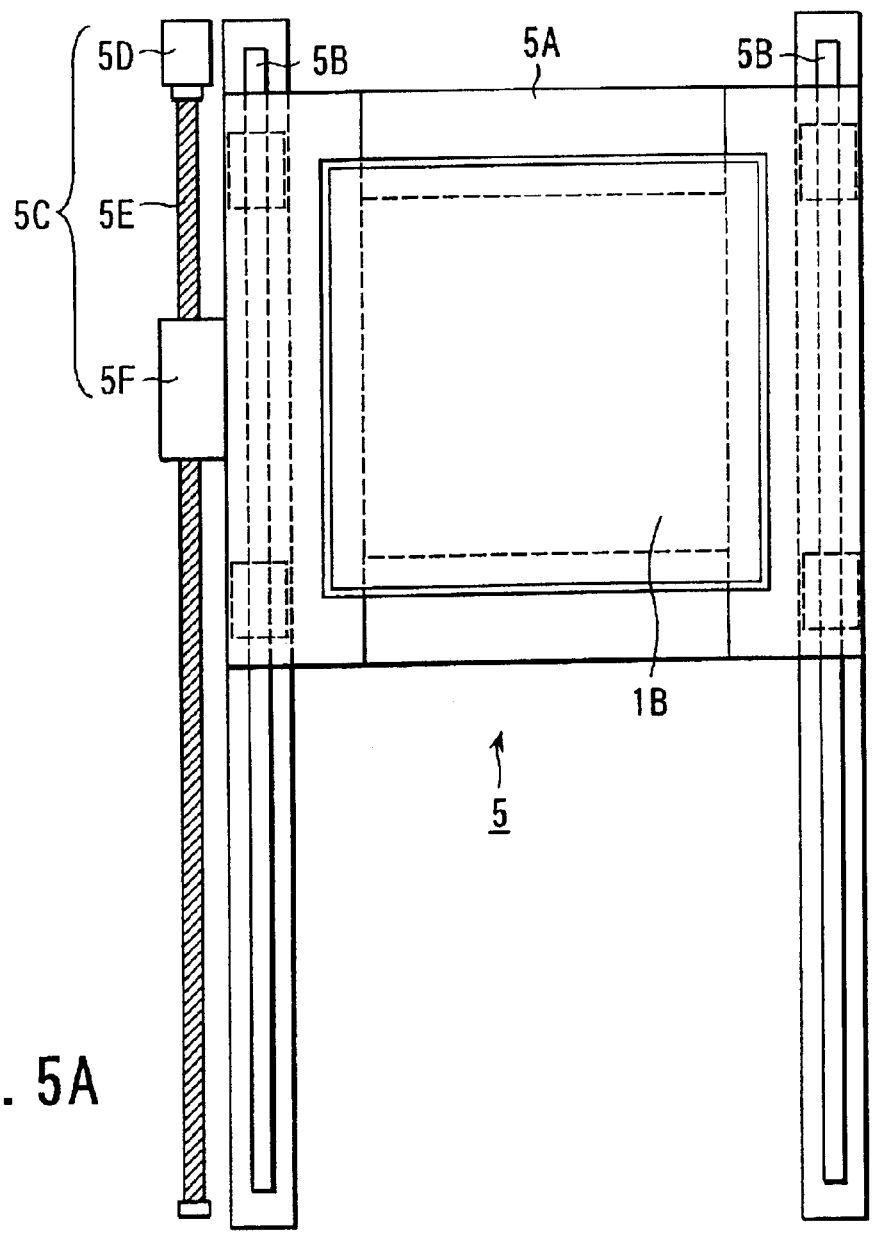
FIG. 5A is a plan view of the mechanism.
Figure 5B:
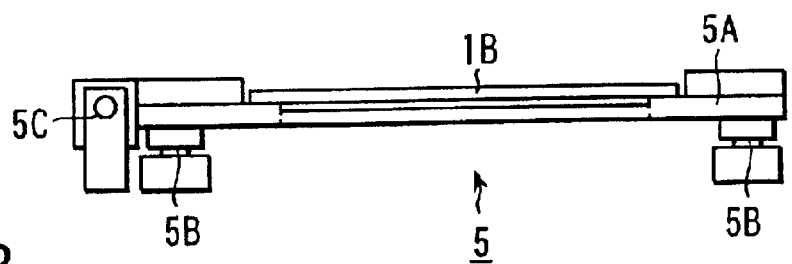
FIG. 5B is a sectional view of the mechanism in a lateral direction.

An example of the second conveying mechanism 5 for conveying the base substrate is shown in FIGS. 1A, 1B and 5. The second conveying mechanism 5 includes a laying guide 5A with the base substrate 1B laid thereon, a pair of Y guide rails 5B, 5B for guiding the laying guide 5A to the holding mechanism 7, and a driving mechanism 5C for moving the laying guide 5A along these Y guide rails 5B, 5B. The second conveying mechanism 5 conveys the base substrate 1B via the laying guide 5A, and transfers the base substrate 1B to the holding mechanism 7. For example, as shown in FIG. 5, the driving mechanism 5C includes a motor 5D, ball screw 5E and nut 5F.

As shown in FIG. 1, the holding mechanism 7 is disposed on the left side of the laying mechanism 3. As shown in FIGS. 6, 7A and 7B, the holding mechanism 7 includes a holder which is fixed to a head plate 6A on an upper surface of the housing 6 and has an L-shaped section. The holding mechanisms will be referred to as the holder hereinafter as the occasion demands. The holder 7 can be disposed on extensions of the Y guide rails 5B, 5B for the second conveying mechanism 5 for conveying the base substrate. The base substrate 1B conveyed by the second conveying mechanism 5 is automatically guided by the holder 7, and held in the predetermined position in the Y direction via a protrusion (not shown). The holding mechanism 7 may include a contact mechanism for allowing a plurality of unit contactors disposed on the substrate for alignment to contact the base substrate, and a heating mechanism.

An example of a contact mechanism 20 is shown in FIG. 6. The contact mechanism 20 includes a pressing mechanism 10 for allowing a plurality of unit contactors to contact the base substrate in an elastic manner. The pressing mechanism 10 includes a support 10A disposed on the head plate 6A and having a flat cap shape, a press member 10B disposed in a lower part of the support 10A, and a plurality of springs 10C for biasing the pressing member 10B downwards. When the laying mechanism 3 is moved up in an arrow direction, the tiles 1A on the substrate for alignment 2 are collectively pressed onto the base substrate 1B held in a center position of the holding mechanism 7. When the tile 1A is attached to the base substrate 1B as described later, the substrate for alignment 2 enters the holders 7, 7 against a biasing force of the pressing mechanism 10.

Figure 7C:
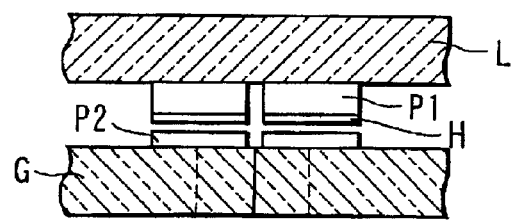

A heating mechanism 11 may include heating means 11A, 11B disposed in two positions, or may have only one of the heating means. The heating mechanism 11 heats the tile 1A and base substrate 1B from both or one of a tile 1A side and a base substrate 1B side in order to electrically connect the tile 1A to the base substrate 1B. One heating means (e.g., heater) 11A is incorporated in the base 3C of the laying mechanism 3, and the other heating means (e.g., heater) 11B is incorporated in the press member 10B. When the base 3C of the laying mechanism 3 moves up in the Z direction from right under the holding mechanism 7, the tile 1A disposed in the substrate for alignment 2 on the base 3C is pressed onto the base substrate 1B against the spring 10C. When the heating mechanism 11 heats the tile 1A and base substrate 1B in this state, the connection pad P1 of the base substrate 1B is bonded to the connection pad P2 of the tile 1A via the solder or wax material H, and the tile 1A is electrically connected to the base substrate 1B (see FIG. 7C). In FIG. 7C, the solder or wax material H is applied onto the connection pad P1, but the material may be applied onto the connection pad P2, or both to the connection pads P1, P2. Furthermore, the solder or wax material H may be replaced with an adhesive or another bonding material. In addition, at least one of both the connection pads P1, P2 can be formed with a metal such as gold having a low melting point. In this case, both the connection pads P1, P2 are heated via neither the solder nor wax material H, whereby they can electrically be connected. In this case, it is not necessary that the solder or wax material H should be applied to both the connection pads P1, P2. Alternatively, at least one of both the connection pads P1, P2 can be formed by the solder. Also in this case, it is unnecessary to additionally apply the solder or wax material H. When materials of the tile 1A and base substrate 1B have a substantially equal or close thermal expansion coefficient, the position of the connection pad P1 hardly deviates from that of the opposite connection pad P2, and the contactor 1 can be assembled with high precision.

In the present embodiment, the positioning mechanism 9 can be used to dispose the tile 1A on the base substrate 1B with high precision. As shown in FIGS. 1A, 1B, the positioning mechanism 9 includes a lower CCD camera 9A and upper CCD camera 9B. The lower CCD camera 9A can be fixed, for example, to the base 3C. A controller (not shown) calculates a position coordinate of a positioning mark based on the position coordinate of the base 3C on the time when the lower CCD camera 9A photographed the positioning mark (e.g., tip-end pyramid of the probe N) of the tile 1A conveyed by the first conveying mechanism 4 from below. The upper CCD camera 9B is fixed, for example, to a middle of an alignment bridge 9C. A pair of guide rails 9D, 9D are disposed above the X guide rails 3D, 3D of the laying mechanism 3 and below the Y guide rail 5B for the second conveying mechanism 5 for conveying the base substrate. The alignment bridge 9C moves along the pair of guide rails 9D, 9D. The upper CD camera 9B moves to a reference position above the base 3C via the alignment bridge 9C, and photographs the positioning mark (e.g., groove 2A) of the substrate for alignment 2 on the base 3C from above. The coordinate of the mark is calculated based on the position coordinate of the base 3C on the time when the mark was photographed. Also when the tile 1A on the base 3C is connected to the base substrate 1B held by the holding mechanism 7, the CCD cameras 9A, 9B can be used. That is, the lower CCD camera 9A photographs the connection pad P1 of the base substrate 1B, the position coordinate of the pad is calculated, the upper CCD camera 9B photographs the connection pad P2 of the tile 1A on the base 3C, and the position coordinate of the pad is calculated.

A third conveying mechanism 13 for conveying the substrate for alignment 2 onto the base 3C can be disposed in the housing 6. The third conveying mechanism 13 includes an arm 13A for conveying the substrate for alignment 2 laid on a tip end of the arm, a rotating/driving mechanism 13B connected to a base end of the arm 13A, and an elevating/driving mechanism (not shown). An alignment mechanism (not shown) for positioning the substrate for alignment 2 beforehand in a predetermined direction may also be disposed in the vicinity of the third conveying mechanism 13.

A method of assembling the contactor of the present invention using the aforementioned assembly apparatus will be described. The tile 1A is laid on the base 8 of the assembly apparatus. Moreover, the substrate for alignment 2 is laid on the arm 13A of the third conveying mechanism 13. Subsequently, the assembly apparatus is driven under control of a controller.

The third conveying mechanism 13 conveys the substrate for alignment 2 positioned in the predetermined direction, and lays the substrate for alignment 2 on the base 3C of the laying mechanism 3. The base 3C moves in the X and Y directions, and stops in the reference position. The alignment bridge 9C of the positioning mechanism 9 moves to the reference position along the guide rails 9D, 9D and then stops. While the base 3C moves, the upper CCD camera 9B photographs the positioning mark (e.g., groove 2A) of the substrate for alignment 2 on the base 3C in a plurality of positions. The position coordinates of each groove 2A is calculated and stored based on a movement amount from the reference position of the base 3C. The positioning mark (tip end of each probe N) of the tile 1A conveyed by the first conveying mechanism 4 is photographed by the lower CCD camera 9A fixed to the base 3C. The tip end (pyramid) of each probe N is aligned with the corresponding groove 2A of the substrate for alignment 2 based on the photographed position. After the tile 1A held by the adsorption pad 4D of the first conveying mechanism 4 is conveyed to above the predetermined position, the adsorption pad 4D moves down and releases an adsorption force, and thereby the tile 1A is laid in the predetermined position on the substrate for alignment. The tile conveying mechanism 4 conveys and lays the next tile 1A into the next groove 2A of the substrate for alignment 2 from the base 8. When this process is repeated, a predetermined number of tiles 1A are arranged on the substrate for alignment 2.

When the tiles 1A are arranged on the substrate for alignment 2, the second conveying mechanism 5 conveys and transfers the base substrate 1B to the holding mechanism 7, and the holding mechanism 7 holds the base substrate 1B. The base 3C of the laying mechanism 3 moves in the X direction, and arrives below the holding mechanism 7. The lower CCD camera 9A photographs the positioning mark (e.g., connection pad P1) of the base substrate 1B held by the holding mechanism 7. The alignment bridge 9C photographs the positioning mark (connection pad P2) of the tile 1A on the base 3C. The connection pad P2 of the tile 1A and the connection pad P1 of the base substrate 1B are positioned based on both images. When the base 3C moves up, the tile 1A contacts the base substrate 1B. At this time, the connection pad P2 of the tile 1A is highly precisely aligned with the connection pad P1 of the corresponding base substrate 1B, and therefore the tile and base substrate securely contact each other. The base 3C moves up against a spring force of the pressing mechanism 10 and stops. The connection pads P1, P2 contact each other in an elastic manner. When the heating mechanism 11 heats the tile 1A and base substrate 1B, the connection pads P1, P2 are electrically connected to each other via the solder H. When the tile 1A and base substrate 1B are electrically and integrally connected to each other via the respective connection pads P1, P2, the contactor 1 is formed. After the contactor 1 is formed, the base 3C with the substrate for alignment 2 laid thereon moves down and returns to its original position. In parallel to this operation, the second conveying mechanism 5 for conveying the base substrate returns the contactor 1 to the original position from the holding mechanism 7. Assembling of the contactor 1 including the tile 1A and base substrate 1B is ended by these series of operations. Subsequently, the next contactor 1 is assembled.

Figure 8:
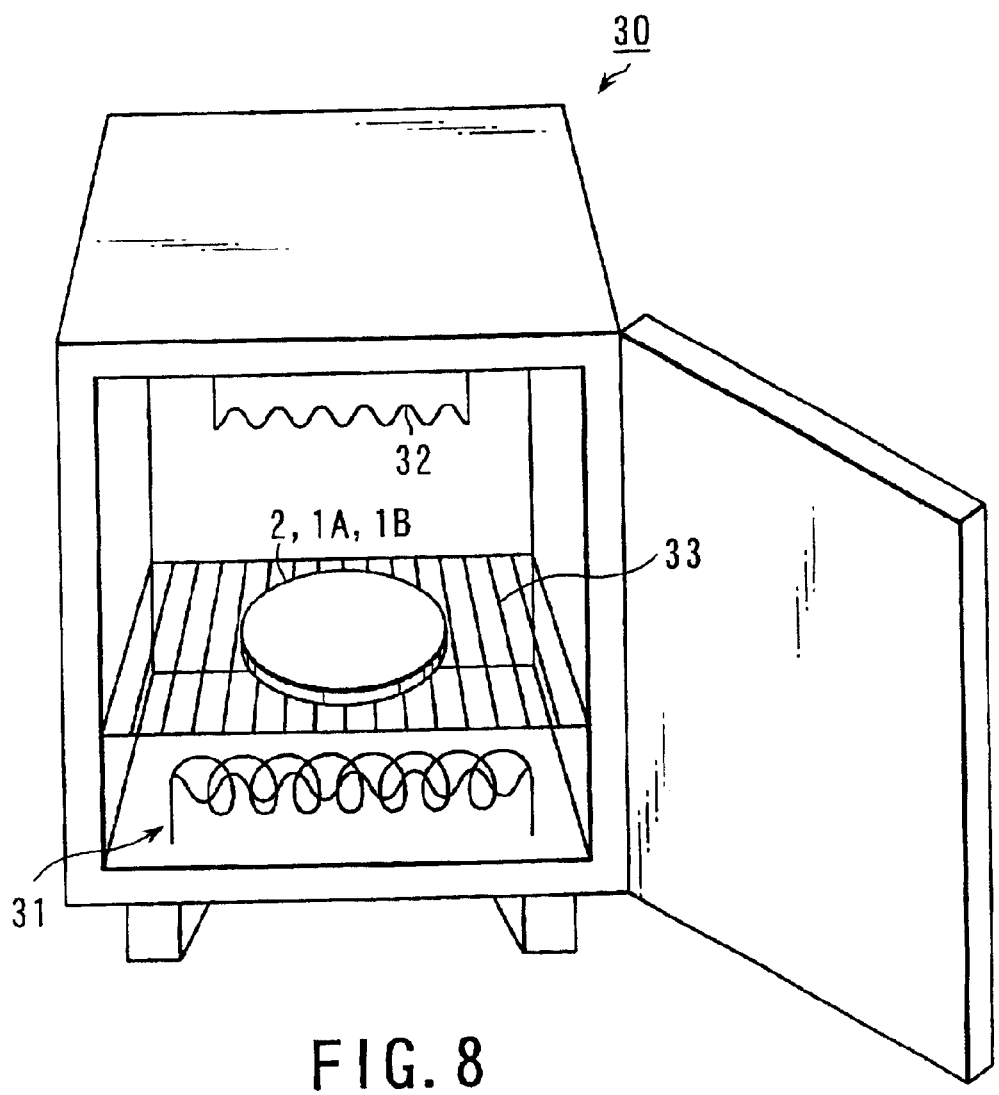
FIG. 8 shows a heating apparatus disposed outside the assembly apparatus.

In the above embodiment, the heating mechanism 11 is disposed in the assembly apparatus, but this heating can also be accomplished by another heating mechanism 11 provided outside the assembly apparatus. FIG. 8 shows the other heating apparatus 30. In this heating apparatus 30, a lower heater 31 and an upper heater 32 are disposed. Additionally, in the heating apparatus, there is disposed a shelf 33 on which the substrate for alignment 2 having the tile 1A and the base substrate 1B thereon is put. The plurality of shelves 33 can be disposed. The tile 1A and the base substrate 1B mounted on the substrate for alignment 2 can be heated (e.g., at 300 to 1000° C.) by the heaters 31, 32, so that both the members are electrically connected.

As in the above embodiment, the base substrate 1B and the tile 1A are made to contact each other. The base substrate 1B and the tile 1A, both mounted on the substrate for alignment 2, are held by a holding jig (not shown), whereby a contact state before the heating can be maintained. While the above state is maintained, the base substrate 1B and the tile 1A mounted on the substrate for alignment 2 are forwarded into a heating apparatus 30 such as a separately disposed heating furnace. At this time, the heating apparatus 30 heats the base substrate 1B and the tile 1A held by the jig. If no jigs are used, a ceramic plate may be mounted on the base substrate 1B. In this case, the ceramic plate can be used as the holding jig for fixing the base substrate 1B and the tile 1A.

Afterward, in this heating apparatus 30, the base substrate 1B and the tile 1A are heated, whereby they are electrically connected to each other.

As understood from the above, when the heating mechanism is disposed as an additional device outside the assembly apparatus, the occurrence of strain in the assembly apparatus due to heating can be prevented, and a constitution of the assembly apparatus can be simplified.

As described above, according to the present embodiment, the assembly apparatus of the present embodiment can be used to assemble the contactor 1 from the tile 1A and base substrate 1B with a high precision.

In the present embodiment, since only a good tile 1A can be used, a generation ratio of defective contactors 1 can be remarkably reduced. According to the present embodiment, a production efficiency of the contactor 1 is enhanced, and a manufacturing cost can be reduced. According to the present embodiment, a test cost can be reduced. A size of the tile 1A itself can further be reduced, and the manufacturing cost of the tile 1A can be reduced. Since a plurality of types of contactors 1 can be assembled by arranging the tiles 1A as basic units, a mask or another component heretofore required for each contactor 1 becomes unnecessary, and the cost can further be reduced.

The present invention is not limited to the aforementioned embodiment. In the method of allowing the unit contactor disposed on the substrate for alignment to contact the base substrate, the substrate for alignment can manually or semi-automatically be brought into contact with the base substrate. A layout of each conveying mechanism may appropriately be changed as the occasion demands. Similarly as the above method, the base substrate can integrally be connected to the interface section. The present invention can broadly be utilized not only in the assembly apparatus of the contactor but also in a similar assembly apparatus for assembling micro components such as a multi-chip module (MCM) onto the base substrate with satisfactory precision.

When the base substrate 1B is diverted, only some tiles 1A turned to be defective in measurement of electric properties of a semiconductor apparatus can be removed from the base substrate 1B, and replaced with new tiles 1A in the assembled contactor 1. Furthermore, when tiles having different shapes are assembled again into the contactor 1, the base substrate 1B can be diverted, and the contactor 1 having new specifications can be formed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A contactor comprising:
   a base substrate, the base substrate comprising:
      an electrically insulating first substrate, the first substrate having a first surface and a second surface;
      at least one first connection pad formed on a first surface of the first substrate;
      at least one electrode for external connection formed on a second surface of the first substrate; and
      a wiring configured to connect each first connection pad to each electrode for external connection;
   unit contactors, a respective unit contactor comprising:
      an electrically insulating second substrate, the second substrate having a first surface and a second surface;

at least one connection pad formed on the first surface of the second substrate;

at least one probe formed on the second surface of the second substrate; and a wiring configured to electrically connect each connection pad to each probe; and an attaching mechanism configured to fix a plurality of unit contactors onto the first surface of the base substrate.

2. The contactor according to claim 1, wherein said attaching mechanism comprises a mechanism configured to electrically connect and fix each second connection pad of each unit contactor to each connection pad of the base substrate.

3. The contactor according to claim 1, wherein said attaching mechanism comprises a mechanism configured to electrically connect and fix each second connection pad of each unit contactor to each connection pad of the base substrate via at least one of a solder and a wax.

4. The contactor according to claim 3, wherein a main material of said solder is gold.

5. The contactor according to claim 1, wherein said at least one probe is of a cantilever type.

6. A substrate for alignment having a first surface, which can be used to manufacture the contactor comprising the unit contactor according to claim 1, said substrate for alignment, the substrate for alignment comprising:

a plurality of convex portions formed on the first surface;

a plurality of concave portions formed among the plurality of convex portions; and a plurality of grooves formed in the plurality of concave portions, wherein said unit contactor comprises at least one prove, and said convex portions support each unit contactor, and said grooves contain a tip end of the prove of each unit contactor.

7. The substrate for alignment according to claim 6, which is mainly manufactured of silicon.

8. The substrate for alignment according to claim 6, wherein said at least one probe is of a cantilever type.

9. A method of manufacturing a contactor which uses the substrate for alignment according to claim 6, said method comprising the steps of:

disposing a predetermined number of unit contactors on the substrate for alignment;

positioning the substrate for alignment and a base substrate;

bringing the predetermined number of unit contactors disposed on the substrate for alignment into contact with the base substrate; and heating at least one of the substrate for alignment and the base substrate, and fixing the predetermined number of unit contactors to the base substrate.

10. An assembly apparatus which can be used to assemble the contactor according to claim 1, said apparatus comprising:

means for laying a base substrate;

means for positioning the substrate for alignment with a unit contactor disposed thereon and the base substrate; and means for disposing the substrate for alignment in the vicinity of the base substrate, and attaching the unit contactor disposed on the substrate for alignment to a predetermined position of the base substrate.

11. The assembly apparatus according to claim 10, wherein said attaching mechanism comprises:

means for bringing the respective unit contactor disposed on the substrate for alignment into contact with the base substrate; and heating means for heating at least one of the substrate for alignment and the base substrate, and fixing a plurality of unit contactors to the base substrate.

* * * * *